United States Patent
Choi

(10) Patent No.: US 11,996,154 B2
(45) Date of Patent: May 28, 2024

(54) PAGE BUFFER CIRCUIT AND NONVOLATILE MEMORY DEVICE INCLUDING THE SAME

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 88 days.

(21) Appl. No.: 17/745,594

(22) Filed: May 16, 2022

(65) Prior Publication Data

US 2023/0107462 A1    Apr. 6, 2023

(30) Foreign Application Priority Data

Oct. 6, 2021   (KR) .................... 10-2021-0132259

(51) Int. Cl.
  *G11C 7/10*   (2006.01)
  *G11C 16/14*  (2006.01)
  *G11C 16/24*  (2006.01)
  *G11C 16/26*  (2006.01)
  *G11C 16/34*  (2006.01)

(52) U.S. Cl.
  CPC ........ *G11C 16/3445* (2013.01); *G11C 7/1048* (2013.01); *G11C 7/1057* (2013.01); *G11C 7/1084* (2013.01); *G11C 16/14* (2013.01); *G11C 16/24* (2013.01); *G11C 16/26* (2013.01)

(58) Field of Classification Search
  CPC . G11C 16/3445; G11C 7/1048; G11C 7/1057; G11C 7/1084; G11C 16/14; G11C 16/24; G11C 16/26; G11C 16/32; G11C 7/106; G11C 7/1087; G11C 16/0483; G11C 2211/5642; G11C 16/10
  See application file for complete search history.

(56) References Cited

U.S. PATENT DOCUMENTS

| | | | |
|---|---|---|---|
| 8,243,528 B2* | 8/2012 | Kwon | G11C 16/16 365/185.21 |
| 2005/0078524 A1* | 4/2005 | Hosono | G11C 16/26 365/185.17 |
| 2006/0274578 A1* | 12/2006 | Kwak | G11C 16/24 365/185.17 |
| 2015/0023103 A1 | 1/2015 | Aritome | |

FOREIGN PATENT DOCUMENTS

KR   1020160095448 A   8/2016

* cited by examiner

*Primary Examiner* — Mohammed A Bashar
(74) *Attorney, Agent, or Firm* — WILLIAM PARK & ASSOCIATES LTD.

(57) ABSTRACT

A page buffer circuit includes an intermediate circuit, a data storage circuit and an enhancive circuit. The intermediate circuit is coupled to a bit line coupled to a memory region and configured to apply a voltage having a voltage level, corresponding to a status of the memory region, to a sensing node. The data storage circuit is configured to store, therein, a value that corresponds to the status of the memory region in response to the voltage level. The enhancive circuit is coupled to the sensing node and configured to increase a capacitance of the sensing node in an enhancive interval during a selected operation.

8 Claims, 13 Drawing Sheets

PAGE BUFFER CIRCUIT AND NONVOLATILE MEMORY DEVICE INCLUDING THE SAME

CROSS-REFERENCES TO RELATED APPLICATION

The present application claims priority under 35 U.S.C. § 119(a) to Korean application number 10-2021-0132259, filed on Oct. 6, 2021, in the Korean Intellectual Property Office, which is incorporated herein by reference in its entirety as set forth in full.

BACKGROUND

1. Technical Field

Various embodiments are related to a memory device, and more particularly, to a nonvolatile memory device.

2. Related Art

An electronic device includes a lot of electronic elements and a computer system as the electronic device includes lots of semiconductor apparatuses, each configured by a semiconductor. Among the semiconductor apparatuses configuring the computer system, a host, such as a processor or a memory controller, performs data communication with a memory device. The memory device includes a plurality of memory cells, each configured to store data therein and each identified by a word line and a bit line.

It is impossible to overwrite data into a nonvolatile memory device, such as a NAND flash, which accordingly requires an erase operation. The nonvolatile memory device may perform an erase operation in units of memory blocks and may erase all data that is stored in one memory block at once through the erase operation. Through an erase-verification operation, the nonvolatile memory device may verify whether a memory block is normally erased.

SUMMARY

In an embodiment, a page buffer circuit may include an intermediate circuit, a data storage circuit, and an enhancive circuit. The intermediate circuit may be coupled to a bit line that is coupled to a memory region and may be configured to apply a voltage having a voltage level, corresponding to a status of the memory region, to a sensing node. The data storage circuit may be configured to store, therein, a value that corresponds to the status of the memory region in response to the voltage level. The enhancive circuit may be coupled to the sensing node and may be configured to increase a capacitance of the sensing node in an enhancive interval during a selected operation.

In an embodiment, a page buffer circuit may include an intermediate circuit, a data storage circuit, and an enhancive circuit. The intermediate circuit may be configured to apply a first operational voltage to a sensing node to pre-charge the sensing node and may be configured to apply a voltage having a voltage level, corresponding to a status of a plurality of strings, to the sensing node during a multi-string-based-erase-verification operation. The data storage circuit may be configured to store, therein, a value that corresponds to the status of the plurality of strings in response to the voltage level. The enhancive circuit may be coupled to the sensing node and may be configured to apply, in an enhancive interval during the multi-string-based-erase-verification operation, an enhancive voltage having a higher voltage than the first operational voltage to the sensing node to pre-charge the sensing node.

In an embodiment, a nonvolatile memory device may include a plurality of strings, a control circuit and a page buffer circuit. The plurality of strings may be coupled to a bit line. The control circuit may be configured to control a multi-string-based-erase-verification operation on the plurality of strings. The page buffer circuit may be coupled to the bit line and may be configured to prevent, in an evaluation interval during the multi-string-based-erase-verification operation, a voltage level of a sensing node from decreasing to a lower level than a reference level when at least one string, among the plurality of strings, is in a programmed status.

DETAILED DESCRIPTION

Exemplary embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The drawings are not necessarily to scale and, in some instances, proportions may have been exaggerated in order to clearly illustrate features of the embodiments. The terminology used herein is for the purpose of describing particular embodiments only and is not intended to be limiting of the disclosure.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It be further understood that the terms "comprises/" "comprising," "includes," and "including" when used in this specification, specify the presence of the stated elements and do not preclude the presence or addition of one or more other elements.

Hereinafter, exemplary embodiments of the present disclosure ill be described below with reference to the accompanying drawings.

In accordance with an embodiment, provided may be a page buffer circuit with improved speed and accuracy of an erase-verification operation and nonvolatile memory device including the same.

Figure 1:
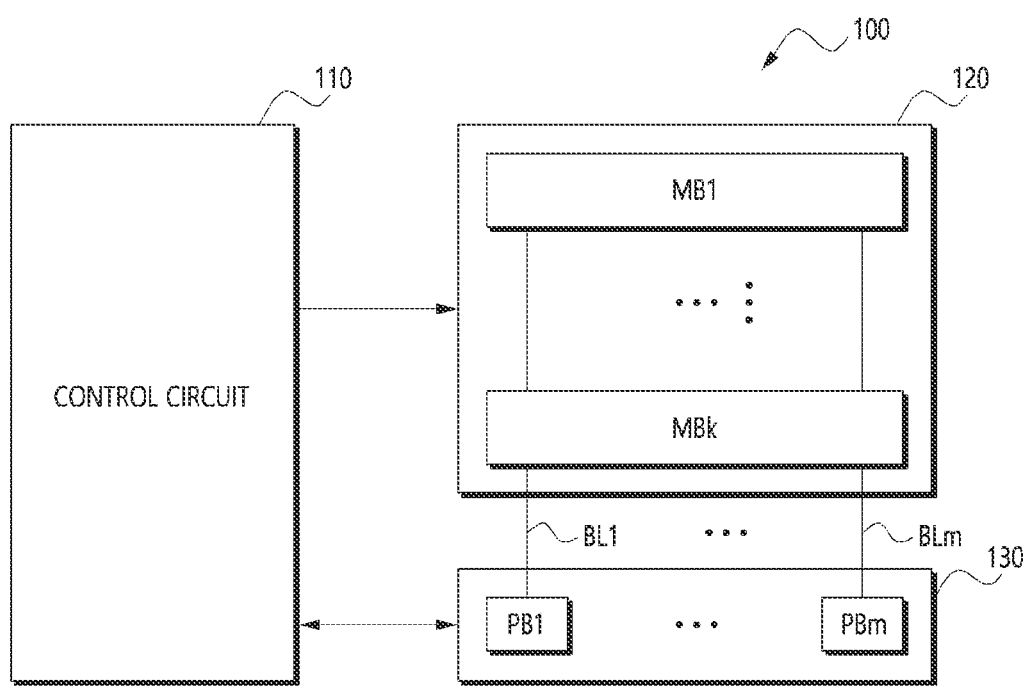
FIG. 1 is a block diagram illustrating a nonvolatile memory device in accordance with an embodiment.

FIG. 1 is a block diagram illustrating a nonvolatile memory device 100 in accordance with an embodiment.

Referring to FIG. 1, the nonvolatile memory device 100 may include a control circuit 110, a memory cell region 120, and a page buffer region 130.

The control circuit 110 may control overall operations of the nonvolatile memory device 100 under the control of an external controller. In response to a command that is provided from the controller, the control circuit 110 may provide control signals to the memory cell region 120 and the page buffer region 130. As described later, the control circuit 110 may control a multi-string-based-erase-verification operation on a plurality of strings that are included in a memory block. The control circuit 110 may include a voltage supply circuit, an interface circuit, a decoding circuit, and so forth.

The memory cell region 120 may include a plurality of memory blocks MB1 to MBk. The nonvolatile memory device 100 may perform an erase operation on the memory blocks MB1 to MBk in units of memory blocks. Through the erase operation, all data that is stored in one of the memory blocks MB1 to MBk may be erased at once.

The page buffer region 130 may transfer data, which is provided from the control circuit 110, to the memory cell region 120 through bit lines BL1 to BLm. The page buffer region 130 may provide data, which is read from the memory cell region 120 through the bit lines BL1 to BLm, to the control circuit 110 such that the read data is output to an external device. The page buffer region 130 may sense a voltage level, which is generated when a memory cell is turned on or off according to a predetermined voltage within the memory cell region 120. According to a result of the sensing, the page buffer region 130 may determine a value that corresponds to a status (e.g., a programmed status, an erased status and so forth) of the memory cell. The page buffer region 130 may include page buffer circuits PB1 to PBm that are respectively coupled to the bit lines BL1 to BLm.

Figure 2:
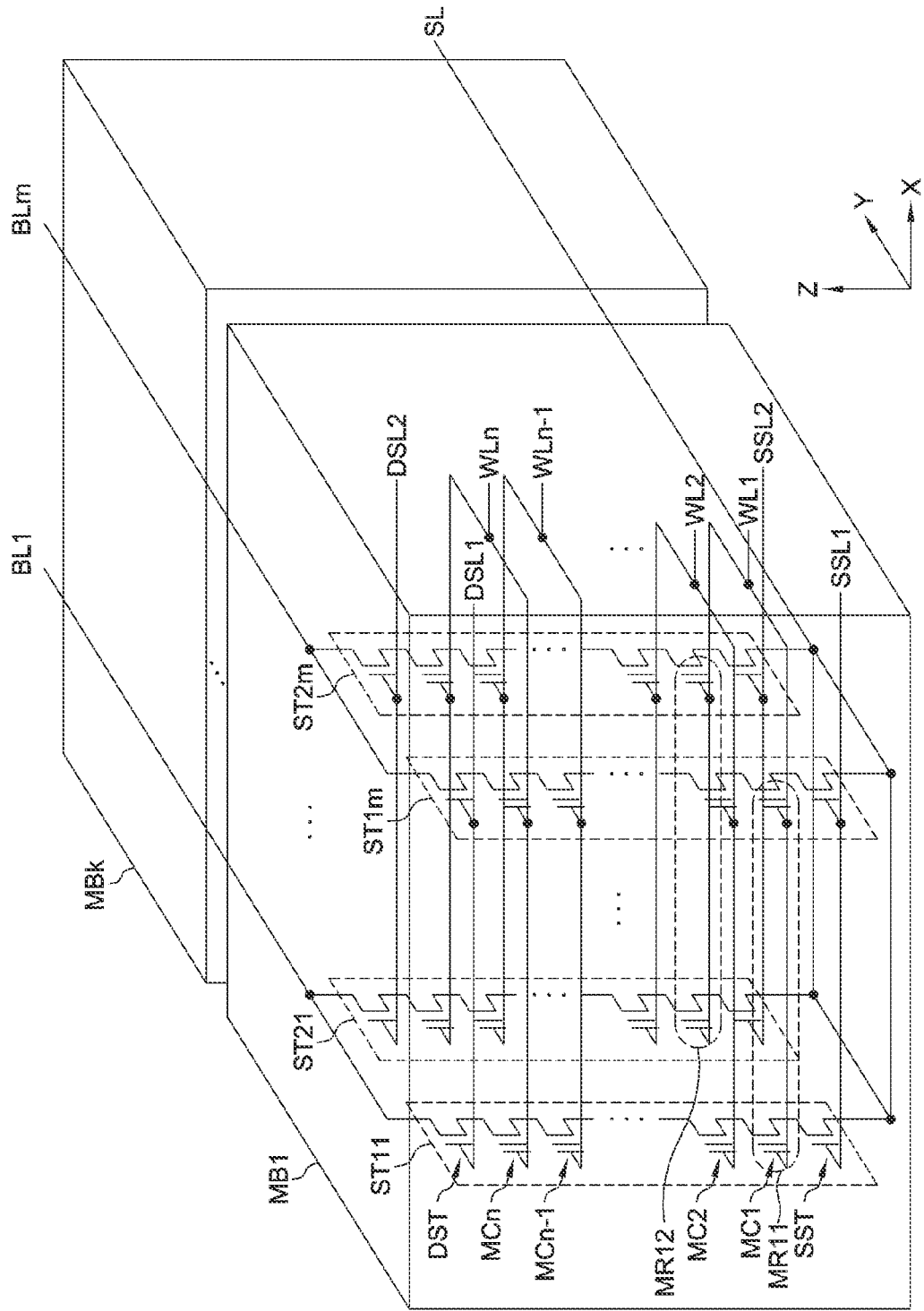
FIG. 2 is a circuit diagram illustrating a memory block in accordance with an embodiment.

FIG. 2 is a circuit diagram illustrating a memory block MB1 in accordance with an embodiment. Each of the memory blocks MB1 to MBk of FIG. 1 may be configured in a similar way to the memory block MB1 of FIG. 2.

Referring to FIG. 2, the memory block MB1 may include a plurality of strings ST11 to ST1$m$ and ST21 to ST2$m$. Each of the strings ST11 to ST1$m$ and ST21 to ST2$m$ may extend along a vertical direction (i.e., a direction of the Z axis). Within the memory block MB1, "m" number of strings may be arranged along a row direction (i.e., a direction of the X axis). Although FIG. 2 exemplifies 2 string groups (each string group being of "m" number of strings) that are arranged along a column direction (i.e., a direction of the Y axis), 3 or more string groups may be arranged along the column direction.

The strings ST11 to ST1$m$ and ST21 to ST2$m$ may be configured in the same way. For example, the string ST11 may include a source selection transistor SST, memory cells MC1 to MCn and a drain selection transistor DST, which are serially coupled to each other between the source line SL and the bit line BL1. The source of the source selection transistor SST may be coupled to the source line SL. The drain of the drain selection transistor DST may be coupled to the bit line BL1. The memory cells MC1 to MCn may be serially coupled to each other between the source selection transistor SST and the drain selection transistor DST.

Gates of the source selection transistors SST within a group of the strings ST11 to ST1$m$ or ST21 to ST2$m$ that are arranged in the same row may be coupled to the same source selection line. For example, gates of the source selection transistors SST within the respective strings ST11 to ST1$m$ that are arranged in the first row may be coupled to the source selection line SSL1. Gates of the source selection transistors SST within the respective strings ST21 to ST2$m$ that are arranged in the second row may be coupled to the source selection line SSL2. In an embodiment, the source selection transistors SST within the respective strings ST11 to ST1$m$ and ST21 to ST2$m$ may be commonly coupled to one source selection line. In an embodiment, the strings Sill to ST1$m$ and ST21 to ST2$m$ may be grouped into several string groups and the source selection transistors SST within the same string group may be commonly coupled to one source selection line. For example, when the strings ST11 to ST1$m$ and ST21 to ST2$m$ are grouped into several string groups, each comprising strings of two rows, the source selection transistors SST within a first string group comprising the strings ST11 to ST1$m$ of the first row and the strings ST21 to ST2$m$ of the second row may be commonly coupled to one source selection line (e.g., a source selection line SSL1 of FIG. 5).

Gates of the drain selection transistors DST within a group of the strings ST11 to ST1$m$ or ST21 to ST2$m$ that are arranged in the same row may be coupled to the same drain selection line. For example, gates of the drain selection transistors DST within the respective strings ST11 to ST1$m$ that are arranged in the first row may be coupled to the drain selection line DSL1. Gates of the drain selection transistors DST within the respective strings ST21 to ST2$m$ that are arranged in the second row may be coupled to the drain selection line DSL2.

The strings that are arranged in the same column may be coupled to the same bit line. For example, the strings ST11 and ST21 that are arranged in the first column may be coupled to the bit line BL1. The strings ST1$m$ and ST2$m$ that are arranged in the m-th column may be coupled to the bit line BLm.

Gates of the memory cells that are arranged in the same location in the vertical direction may be coupled to the same word line. For example, gates of the memory cells that are arranged in the same location as the memory cell MC1 in the vertical direction within the strings ST11 to ST1m and ST21 to ST2m may be coupled to the word line WL1.

Among the memory cells within the memory block MB1, memory cells that are arranged in the same row and coupled to the same word line may configure one memory region. For example, the memory cells that are arranged in the first row and coupled to the word line WL1 may configure a memory region MR11. The memory cells that are arranged in the second row and coupled to the word line WL1 may configure a memory region MR12. Depending on the number of rows, each word line may be coupled to a plurality of memory regions. The memory cells that configure one memory region may be programmed at the same time. The one memory region may be a page.

In an embodiment, the memory block MB1 may be further coupled to one or more dummy word lines as well as the word lines WL1 to WLn and may further include dummy memory cells that are coupled to the dummy word lines.

Figure 3:
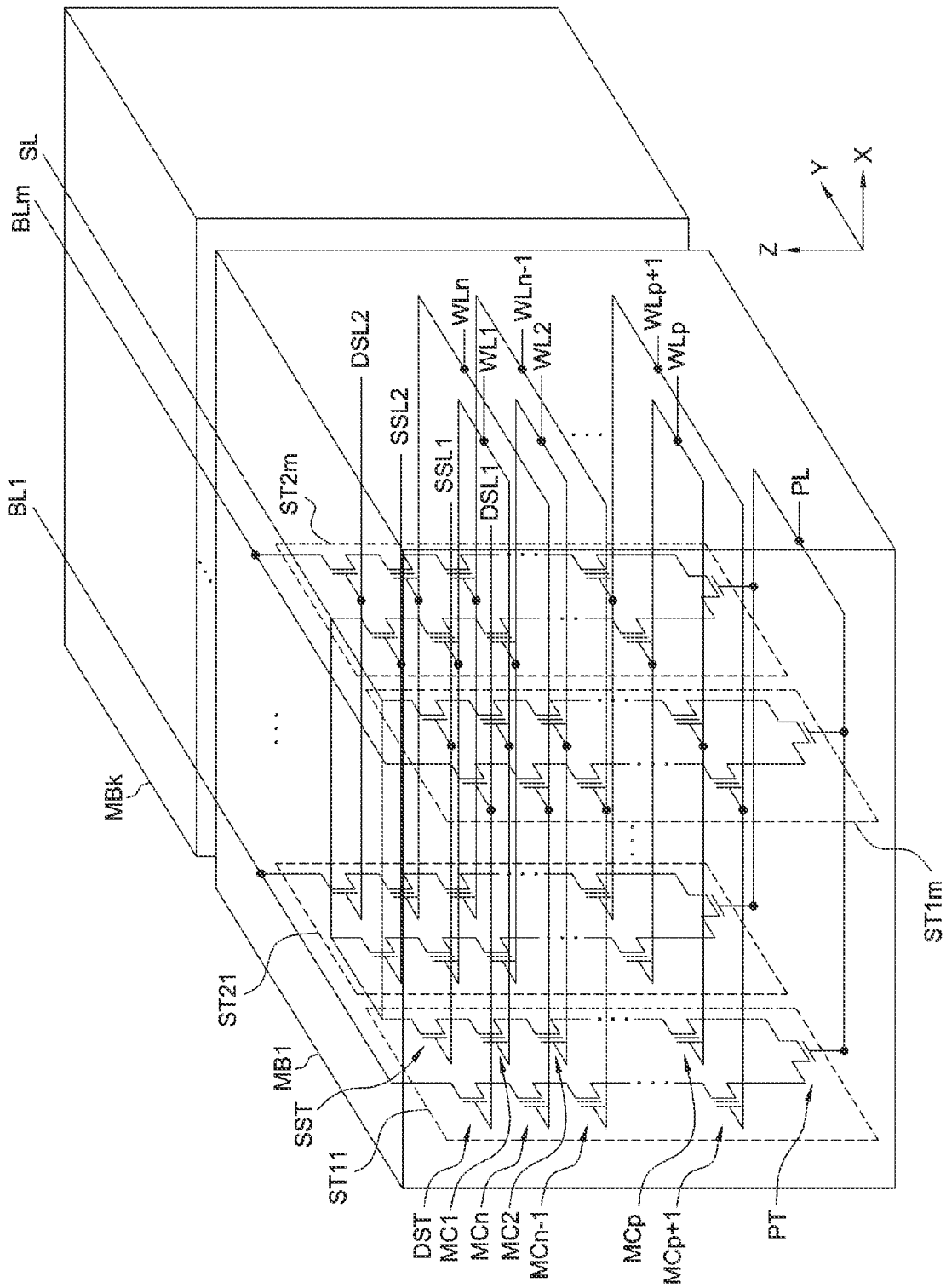
FIG. 3 is a circuit diagram illustrating a memory block in accordance with an embodiment.

FIG. 3 is a circuit diagram illustrating a memory block MB1 in accordance with an embodiment. Each of the memory blocks MB1 to MBk of FIG. 1 may be configured in a similar way to the memory block MB1 of FIG. 3.

Referring to FIG. 3, the memory block MB1 may include a plurality of strings ST11 to ST1m and ST21 to ST2m. Each of the strings ST11 to ST1m and ST21 to ST2m of FIG. 3 may be configured to operate in a similar way as each of the strings ST11 to ST1m and ST21 to ST2m of FIG. 2, However, each of the strings ST11 to ST1m and ST21 to ST2m of FIG. 3 may be formed to have a U-shape and may further include a pipe transistor PT. The gate of the pipe transistor PT may be coupled to a pipe line PL. Among the memory cells MC1 to MCn within each of the strings ST11 to ST1m and ST21 to ST2m, memory cells MC1 to MCp may be sequentially arranged in the reverse Z direction and may be serially coupled to each other between the source selection transistor SST and the pipe transistor PT. Among the memory cells MC1 to MCn within each of the strings ST11 to ST1m and ST21 to ST2m, memory cells MCp+1 to MCn may be sequentially arranged in the Z direction and may be serially coupled to each other between the pipe transistor PT and the drain selection transistor DST.

Figure 4:
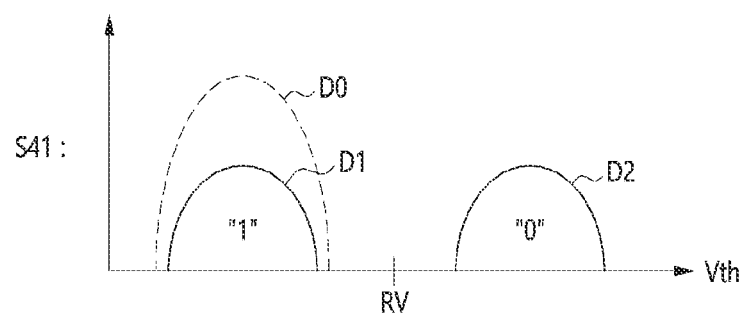
FIG. 4 is a diagram illustrating threshold voltage distributions of memory cells.
Figure 4:
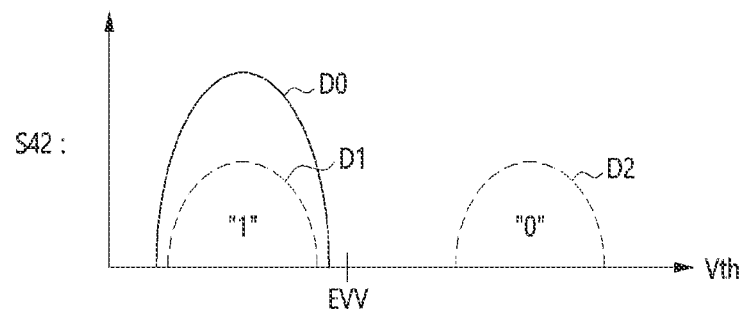

FIG. 4 is a diagram illustrating threshold voltage distributions D0 to D2 of memory cells. The graph of FIG. 4 shows the threshold voltage Vth of a memory cell in a horizontal direction and the number of memory cells in a vertical direction.

Referring to FIG. 4, in a situation S41, a plurality of memory cells that are coupled to one word line and in an erased status may form the threshold voltage distribution D0. Through a program operation, the memory cells may form the threshold voltage distributions D1 and D2. For example, the memory cells that form the threshold voltage distribution D1 may have a status storing data "1". For example, the memory cells that form the threshold voltage distribution D2 may have a status storing data "0". When a predetermined read voltage RV is applied to a word line that is coupled to the memory cells, the memory cells that form the threshold voltage distribution D1 may be turned on and a current may run through the memory cells that form the threshold voltage distribution D1. When the read voltage RV is applied to the word line that is coupled to the memory cells, the memory cells that form the threshold voltage distribution D2 may be turned off and a current might not run through the memory cells that form the threshold voltage distribution D2. Accordingly, the status of each memory cell or data that is stored in each memory cell may be determined based on the voltage level that is formed on a sensing node of a page buffer circuit due to the current.

In a situation S42, the memory cells that have formed the threshold voltage distributions D0 to D2 may form the threshold voltage distribution D0 through an erase operation. That is, the memory cells that have stored, therein, the data "0" and thus have formed the threshold voltage distribution D2 may move back to the threshold voltage distribution D0. The status storing the data "0" may be a programmed status. The status storing the data "1" may be an erased status.

During an erase operation, an erase-verification operation may be performed to verify whether a memory cell is completely erased. The erase-verification operation may include an operation of determining whether memory cells are in the erased status by applying a predetermined erase-verification voltage EVV to a word line that is coupled to the memory cells. For example, during the erase-verification operation, when all memory cells are determined to be in the erased status, the memory cells may be determined to be 'erase-pass', During the erase-verification operation, when at least one of the memory cells is determined to be in the programmed status, the memory cells may be determined to be 'erase-fail' and an erase voltage may be applied again to the word lines that are coupled to the memory cells.

In an embodiment, during the erase-verification operation, the determination of 'erase-pass' or 'erase-fail' may depend on whether the number of memory cells in the programmed status is greater than a threshold value. For example, during the erase-verification operation, when the number of memory cells in the programmed status is determined to be greater than the threshold value, the memory cells may be determined to be 'erase-fail'. During the erase-verification operation, when the number of memory cells in the programmed status is determined to be equal to or less than the threshold value, the memory cells may be determined to be 'erase-pass'.

Figure 5:
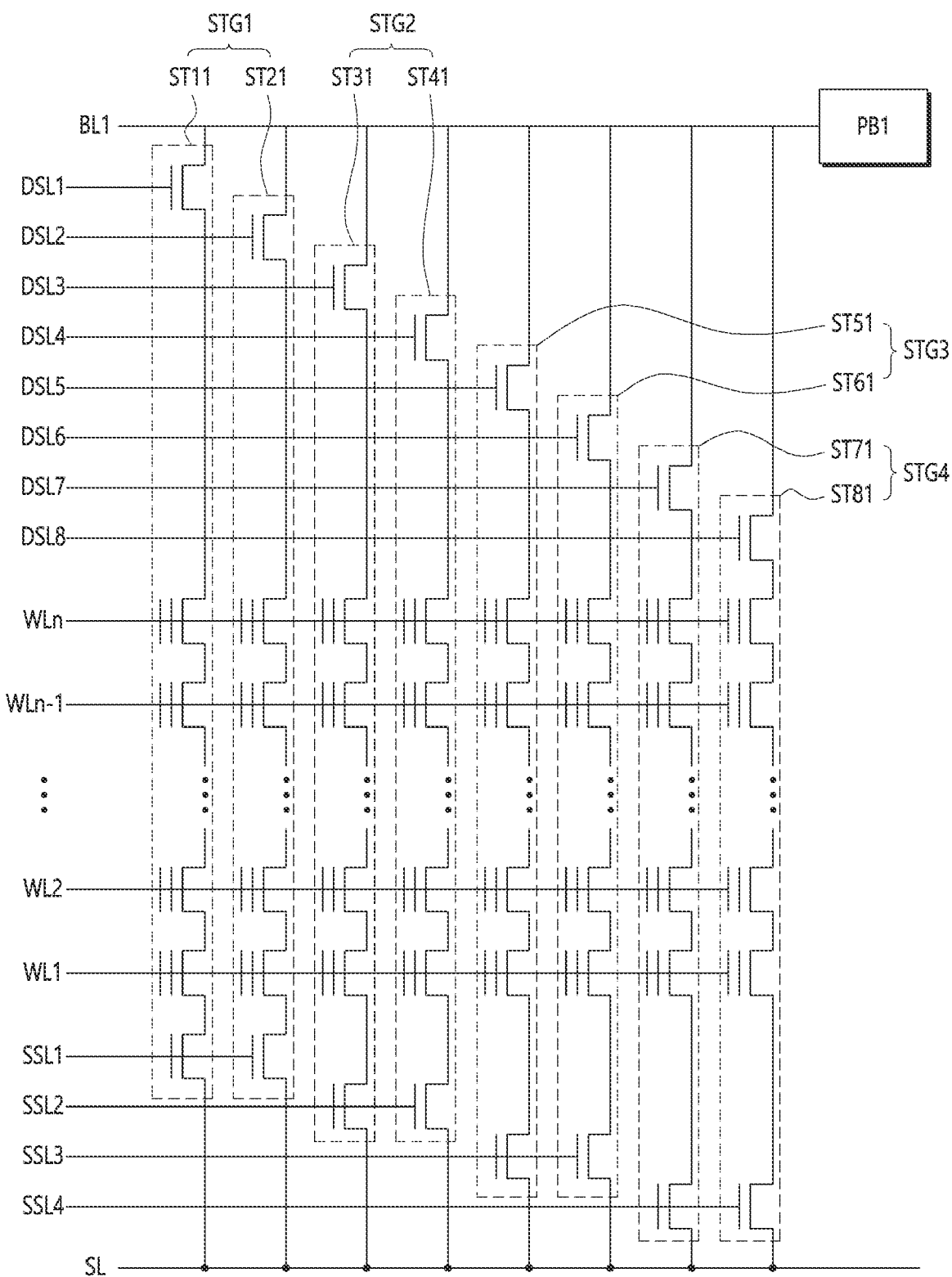
FIG. 5 is a block diagram illustrating strings coupled to a bit line within a memory block in accordance with an embodiment.

FIG. 5 is a block diagram illustrating strings ST11 to ST81 that are coupled to a bit line BL1 within the memory block MB1 in accordance with an embodiment. In the embodiment of FIG. 5, it is assumed that the bit line BL1 is coupled to eight strings, first to eighth strings ST11 to ST81, as an example.

Referring to FIG. 5, each of the first to eighth strings ST11 to ST81 may have a similar configuration to the string, described with reference to FIG. 2. When the first to eighth strings ST11 to ST81 are grouped into first to fourth string groups STG1 to STG4, each including 2 strings, strings that are included in the same group may be controlled through the same source selection line. For example, the source selection transistors that are included in respective first and second strings ST11 and ST21 that are included in the first string group STG1 may be commonly coupled to a source selection line SSL1. According to an embodiment, the number of strings that are included in one string group will not be limited to two. In an embodiment, the first string group STG1 may further include the strings that are arranged in the same rows as the strings ST11 and ST21 within the memory block MB1 of FIG. 2.

In an embodiment, the strings that are arranged in the same column (i.e., the strings coupled to the same bit line) within the memory block MB1 of FIG. 3 may be grouped into a plurality of string groups, as described with reference to FIG. 5.

In an embodiment, an erase-verification operation may be performed by reading, at the same time, memory cells that are included in each string. Such erase-verification operation may be referred to as a single-string-based-erase-verification operation. Specifically, in order to read, at the same time, memory cells that are included in the first string ST11, an erase-verification voltage (e.g., the erase-verification voltage EVV described with reference to FIG. 4) may be applied to all the word lines WL1 to WLn at the same time. Also, the drain selection line DSL1 and the source selection line SSL1 may be enabled. When all memory cells that are included in the first string ST11 are in the erased status, all memory cells may be turned on. Accordingly, a current may flow from a sensing node of the page buffer circuit PB1 to the source line SL through the first string Sill, and therefore, this may lead to the sensing node having a relatively low voltage level and the first string ST11 may be determined to be in the erased status based on the voltage level of the sensing node.

However, when at least one memory cell remains in the programmed status in the first string ST11, the memory cell may be turned off. Accordingly, a current cannot flow from the sensing node of the page buffer circuit PB1 to the source line SL through the first string ST11, and therefore, this may lead to the sensing node having a relatively high voltage level, and the first string ST11 may be determined to be in the programmed status based on the voltage level of the sensing node. That is, the first string ST11 that remains in the programmed status may mean that there is at least one memory cell in the programmed status in the first string ST11.

According to an embodiment, a multi-string-based-erase-verification operation may be performed. The multi-string-based-erase-verification operation may be an erase-verification operation that is performed in units of string groups. In other words, the multi-string-based-erase-verification operation may be performed, at the same time, on strings that are coupled to the same bit line and are included in the same string group within a memory block. For example, the multi-string-based-erase-verification operation may be sequentially performed on the first to fourth string groups STG1 to STG4. The multi-string-based-erase-verification operation that is performed on the first to fourth string groups STG1 to STG4 within a memory block may sequentially erase the memory block faster than the single-string-based-erase-verification operation on the respective first to eighth strings ST11 to ST81 within the first to fourth string groups STG1 to STG4.

The multi-string-based-erase-verification operation may be performed by reading, at the same time, memory cells that are included in the same string group. For example, when the multi-string-based-erase-verification operation is performed on the first string group STG1, the drain selection lines DSL1 and DSL2 and the source selection line SSL1, which are coupled to the first and second strings ST11 and ST21, may be enabled. Remaining processes during the multi-string-based-erase-verification operation on the first string group STG1 may be performed in a similar way as the single-string-based-erase-verification operation, described above. The voltage levels of the sensing node may be different from each other in cases in which both the first and second strings Sill and ST21 change to be in the erased status and in the programmed status and only one of the first and second strings ST11 and ST21 changes to be in the erased status. Accordingly, the status of the first string group STG1 may be determined based on the voltage level of the sensing node.

Figure 6:
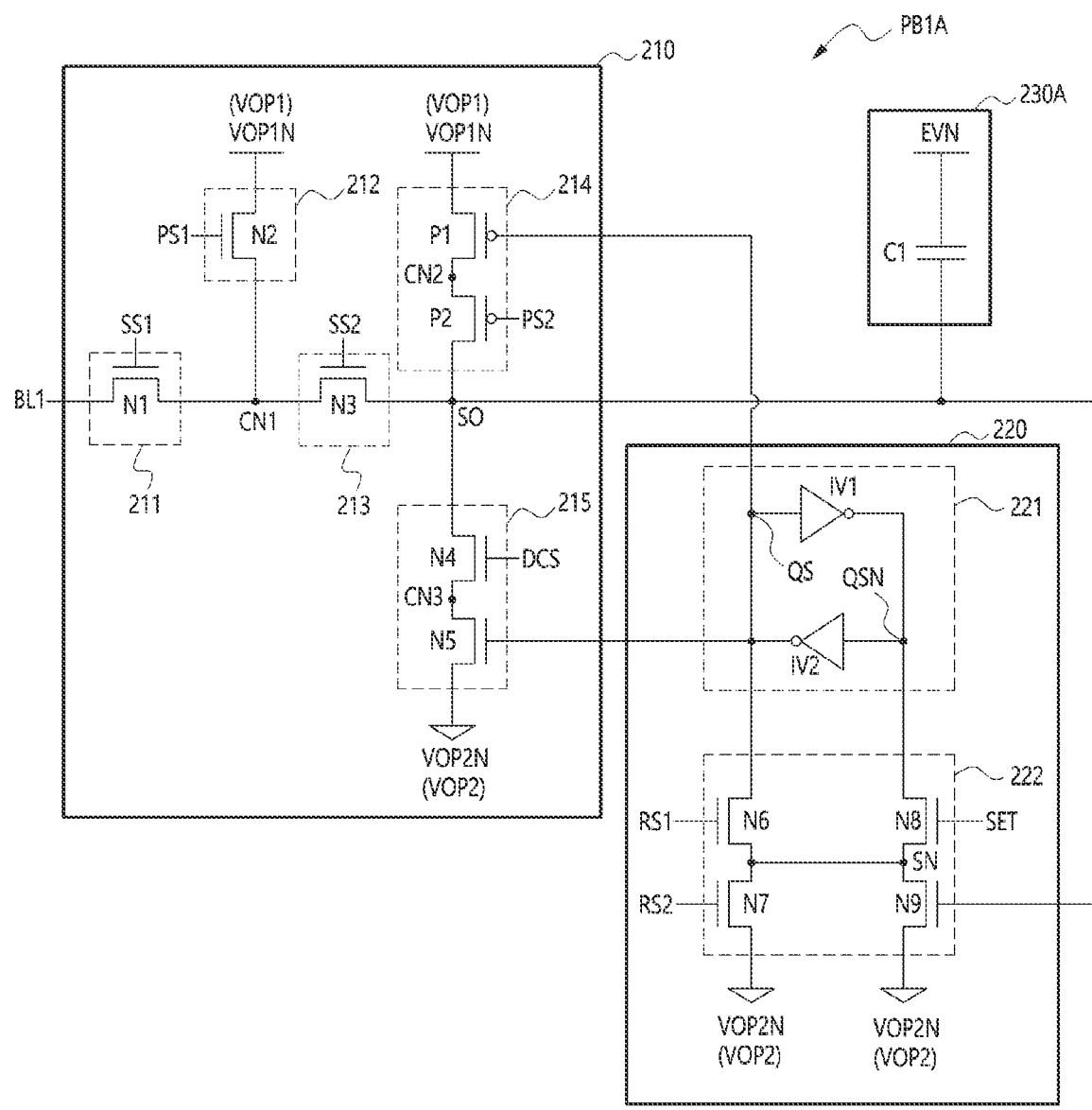
FIG. 6 is a detailed circuit diagram illustrating a page buffer circuit of FIG. 1 in accordance with an embodiment.

FIG. 6 is a detailed circuit diagram illustrating a page buffer circuit PB1A of FIG. 1 in accordance with an embodiment, Each of the page buffer circuits PB1 to PBm of FIG. 1 may be configured and operate in the similar way to the page buffer circuit PB1A.

Referring to FIG. 6, the page buffer circuit PB1A may be coupled to the bit line BL1 and may store a value that corresponds to a status of the string group that is coupled to the bit line BL1 during the multi-string-based-erase-verification operation. Based on the value that is stored in the page buffer circuit PB1A, the control circuit 110 may determine whether the string group is in the erased status or at least one string within the string group is in the programmed status. The page buffer circuit PB1A may operate based on signals SS1, SS2, PS1, PS2, DCS, SET, RS1, and RS2 and first and second operational voltages VOP1 and VOP2, which are provided from the control circuit 110.

The page buffer circuit PB1A may include an intermediate circuit 210, a data storage circuit 220, and an enhancive circuit 230A. The intermediate circuit 210 may be coupled to the bit line BL1, may apply the first operational voltage VOP1 to a sensing node SO to pre-charge the sensing node SO and may form, on the sensing node SO, a voltage level that corresponds to the status of the string group. In response to the voltage level formed on the sensing node SO, the data storage circuit 220 may store, therein, the value that corresponds to the status of the string group. The enhancive circuit 230A may be coupled to the sensing node SO and may increase the capacitance of the sensing node SO in an enhancive interval during the multi-string-based-erase-verification operation.

The intermediate circuit 210 may include a first coupling circuit 211, a first precharging circuit 212, a second coupling circuit 213, a second precharging circuit 214, and a discharging circuit 215.

The first coupling circuit 211 may be coupled between the bit line BL1 and a first intermediate node CN1. In response to the enabled first coupling signal SS1, the first coupling circuit 211 may couple the bit line BL1 to the first intermediate node CN1. The first coupling circuit 211 may include a first NMOS transistor N1. In response to the first coupling signal SS1 that is enabled to a logic high level, the first NMOS transistor N1 may couple the bit line BL1 to the first intermediate node CN1.

The first precharging circuit 212 may be coupled between a first operational voltage node VOP1N and the first intermediate node CN1. In response to the enabled first pre-charge signal PS1, the first precharging circuit 212 may couple the first operational voltage node VOP1N to the first intermediate node CN1. In response to the enabled first pre-charge signal PS1, the first precharging circuit 212 may charge the first intermediate node CN1 by utilizing the first operational voltage VOP1. The first operational voltage VOP1 may be supplied through the first operational voltage node VOP1N. For example, the first operational voltage VOP1 may be a core voltage. The control circuit 110 may generate the first operational voltage VOP1 based on an external voltage provided from an external device. The first precharging circuit 212 may include a second NMOS transistor N2. In response to the first pre-charge signal PS1 that is enabled to a logic high level, the second NMOS transistor N2 may couple the first operational voltage node VOP1N to the first intermediate node CN1.

The second coupling circuit 213 may be coupled between the first intermediate node CN1 and the sensing node SO, In response to the enabled second coupling signal SS2, the second coupling circuit 213 may couple the first intermediate node CN1 to the sensing node SO. The second coupling circuit 213 may include a third NMOS transistor N3. In response to the second coupling signal SS2 that is enabled to a logic high level, the third NMOS transistor N3 may couple the first intermediate node CN1 to the sensing node SO.

The second precharging circuit 214 may be coupled between the first operational voltage node VOP1N and the sensing node SO. In response to the second pre-charge signal PS2 and a voltage level of a data node QS, the second precharging circuit 214 may couple the first operational voltage node VOP1N to the sensing node SO. In response to the enabled second pre-charge signal PS2 and a value of the data node QS having a logic low level, the second precharging circuit 214 may charge the sensing node SO by utilizing the first operational voltage VOP1. The second precharging circuit 214 may include a first PMOS transistor P1 and a second PMOS transistor P2. In response to the value of the data node QS having a logic low level, the first PMOS transistor P1 may couple the first operational voltage node VOP1N to a second intermediate node CN2. In response to the pre-charge signal PS2 that is enabled to a logic low level, the second PMOS transistor P2 may couple the second intermediate node CN2 to the sensing node SO.

The discharging circuit 215 may be coupled between the sensing node SO and a second operational voltage node VOP2N. In is response to the voltage level of the data node QS and the discharge signal DCS, the discharging circuit 215 may couple the sensing node SO to the second operational voltage node VOP2N. The second operational voltage VOP2 may be supplied through the second operational voltage node VOP2N. For example, the second operational voltage VOP2 may be a ground voltage. The control circuit 110 may generate, as the second operational voltage VOP2, an internal ground voltage based on a ground voltage that is provided from an external device. In response to the enabled discharge signal DCS and the value of the data node QS having a logic high level, the discharging circuit 215 may discharge the sensing node SO. The discharging circuit 215 may include a fourth NMOS transistor N4 and a fifth NMOS transistor N5. In response to the discharge signal DCS that is enabled to a logic high level, the fourth NMOS transistor N4 may couple the sensing node SO to a third intermediate node CN3. In response to the value of the data node QS having a logic high level, the fifth NMOS transistor N5 may couple the third intermediate node CN3 to the second operational voltage node VOP2N.

The data storage circuit 220 may include a storage circuit 221 and a set circuit 222.

The storage circuit 221 may store, therein, a value that corresponds to the voltage level of the sensing node SO. The storage circuit 221 may include a first inverter IV1 and a second inverter IV2. Each of the first inverter IV1 and the second inverter IV2 may be coupled between the data node QS and an inversion data node QSN, The first inverter IV1 may receive the value of the data node QS and may invert the value of the data node QS to output the inverted value to the inversion data node QSN. The second inverter IV2 may receive the value of the inversion data node QSN and may invert the value of the inversion data node QSN to output the inverted value to the data node QS. The first inverter IV1 and the second inverter IV2 may operate as a latch configured to keep the value of the data node QS and the inversion data node QSN. According to an embodiment, the storage circuit 221 may be configured by another element capable of storing, therein, the value that corresponds to the voltage level of the sensing node SO.

The set circuit 222 may initialize the storage circuit 221 and may control the storage circuit 221 to store, therein, the value that corresponds to the voltage level of the sensing node SO. The set circuit 222 may include sixth to ninth NMOS transistors N6 to N9.

The sixth NMOS transistor N6 may be coupled between the data node QS and a set node SN. In response to the first reset signal RS1 that is enabled to a logic high level, the sixth NMOS transistor N6 may couple the data node QS to the set node SN. The seventh NMOS transistor N7 may be coupled between the set node SN and the second operational voltage node VOP2N. In response to the second reset signal RS2 that is enabled to a logic high level, the seventh NMOS transistor N7 may couple the set node SN to the second operational voltage node VOP2N. The eighth NMOS transistor N8 may be coupled between the inversion data node QSN and the set node SN. In response to the set signal SET that is enabled to a logic high level, the eighth NMOS transistor N8 may couple the inversion data node QSN to the set node SN. The ninth NMOS transistor N9 may be coupled between the set node SN and the second operational voltage node VOP2N. In response to the voltage level of the sensing node SO, the ninth NMOS transistor N9 may couple the set node SN to the second operational voltage node VOP2N.

The enhancive circuit 230A may include a capacitor C1, The capacitor C1 may be coupled between an enhancive node EVN and the sensing node SO.

In a predetermined enhancive interval during the multi-string-based-erase-verification operation, the enhancive node EVN may be provided with the second operational voltage VOP2, that is, the ground voltage. In other intervals, other than the enhancive interval, during the multi-string-based-erase-verification operation, the enhancive node EVN may be floated. Also, the enhancive node EVN may be floated while the mufti-string-based-erase-verification operation is not being performed.

Figure 7:
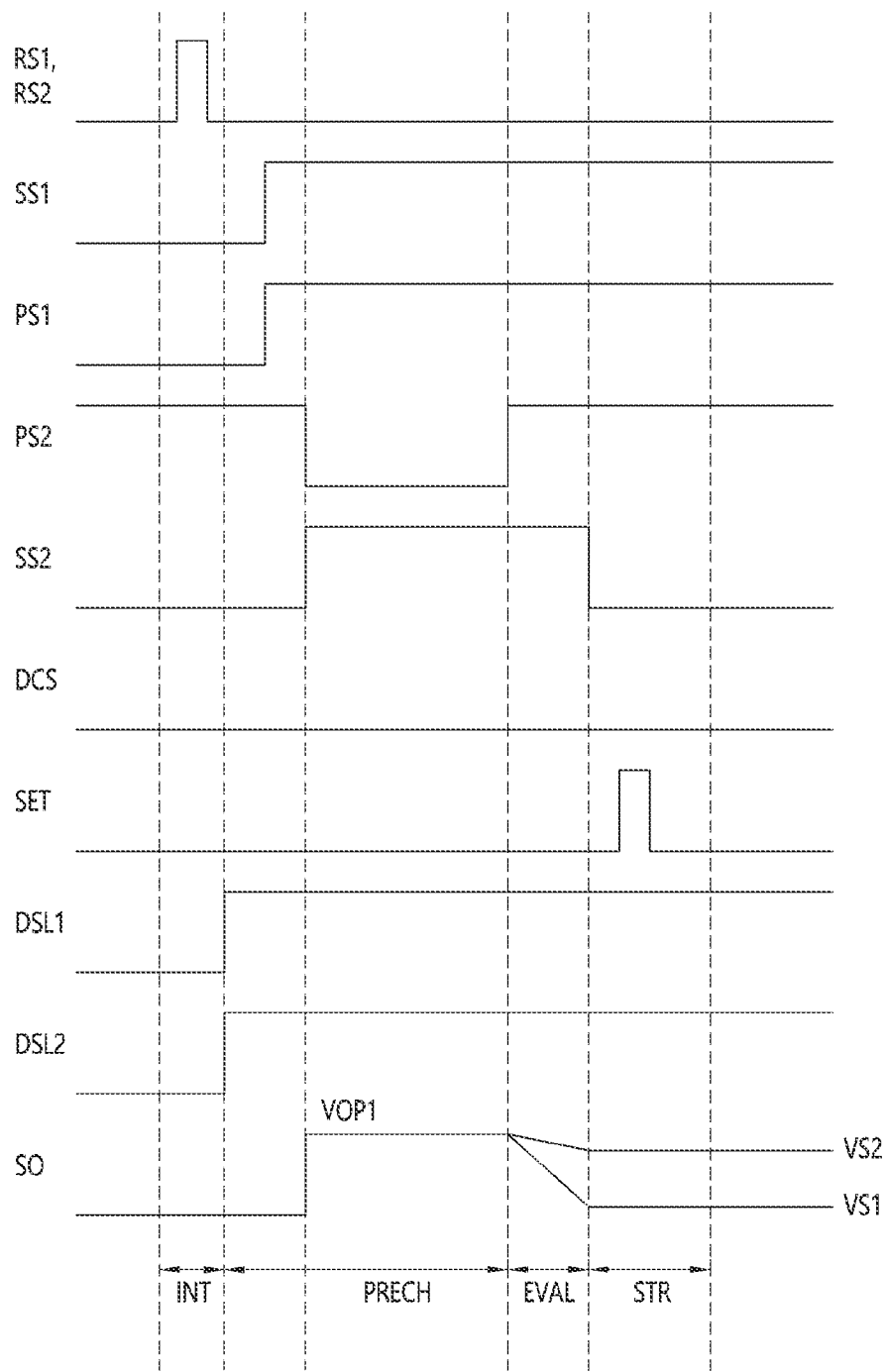
FIG. 7 is a timing diagram illustrating signals applied to a page buffer circuit of FIG. 6 when an enhancive circuit does not operate during a multi-string-based-erase-verification operation.

According to an embodiment, each of the first to ninth NMOS transistors N1 to N9 and first and second PMOS transistors P1 and P2 may be replaced with another switching element configured to couple and decouple two nodes in response to the control signal, FIG. 7 is a timing diagram illustrating signals applied to the page buffer circuit PB1A of FIG. 6 when the enhancive circuit 230A does not operate during a multi-string-based-erase-verification operation. The multi-string-based-erase-verification operation may be performed, at the same time, on the first string ST11 and the second string ST21 that are included in the first string group STG1. The enhancive circuit 230A might not operate as the enhancive node EVN floats. The operation illustrated in FIG. 7 may be an operation when the page buffer circuit PB1A does not include the enhancive circuit 230A.

Referring FIGS. 6 and 7, the multi-string-based-erase-verification operation may include an initialization interval INT, a pre-charge interval PRECH, an evaluation interval EVAL, and a data storage interval STR.

In the initialization interval INT during the multi-string-based-erase-verification operation, the data storage circuit 220 may be initialized. Specifically, in the initialization interval INT, the sixth and seventh NMOS transistors N6 and N7 may be turned on in response to the first and second reset signals RS1 and RS2, which are enabled to a logic high level. Therefore, the data node QS may be initialized to have a value "0" or a value of a logic low level, and the inversion data node QSN may be initialized to have a value "1" or a value of a logic high level.

In the pre-charge interval PRECH during the multi-string-based-erase-verification operation, the intermediate circuit 210 may pre-charge the bit line BL1 and the sensing node SO to the first operational voltage VOP1 according to the control of the control circuit 110. Specifically, the pre-charge interval PRECH may start when the drain selection lines DSL1 and DSL2 that correspond to the first and second strings ST11 and ST21 are enabled. When the drain selection lines DSL1 and DSL2 are enabled in the pre-charge interval PRECH, the drain selection transistors that are coupled to the drain selection lines DSL1 and DSL2 may be turned on. The first NMOS transistor N1 may be turned on in response to the first coupling signal SS1 that transitions from a logic low level to a logic high level. The second NMOS transistor N2 may be turned on in response to the first pre-charge signal PS1 that transitions from a logic low level to a logic high level. The first PMOS transistor P1 may be turned on in response to the value of the data node QS having the logic low level. The second PMOS transistor P2 may be turned on in response to the second pre-charge signal PS2 that transitions from the logic high level to a logic low level. The third NMOS transistor N3 may be turned on in response to the second coupling signal SS2 that transitions from the logic low level to a logic high level. Therefore, the bit line BL1 and the sensing node SO may be charged to the first operational voltage VOP1. According to an embodiment, the signals in the pre-charge interval PRECH may be enabled in a different order from the illustration. When the second pre-charge signal PS2 becomes disabled, the pre-charge interval PRECH may end and the evaluation interval EVAL may start.

In the evaluation interval EVAL during the multi-string-based-erase-verification operation, the voltage level of the sensing node SO may change according to the statuses of the memory cells that are coupled to the first string ST11 and the second string ST21. Specifically, in the evaluation interval EVAL, the second PMOS transistor P2 may be turned off in response to the second pre-charge signal PS2 that transitions from a logic low level to a logic high level.

Then, when all memory cells that are included in the first string ST11 and the second string ST21 have threshold voltages that are lower than the erase-verification voltage EVV, that is, when all memory cells are in an erased status, all memory cells may be turned on in response to the erase-verification voltage EVV. Therefore, the charges on the sensing node SO may be discharged to the source line SL through the bit line BL1 and the voltage level of the sensing node SO may be lowered to a first sensing level VS1.

On the other hand, when at least one memory cell included in the first string ST11 and at least one memory cell included in the second string ST21 have the threshold voltages each higher than the erase-verification voltage EVV, that is, when the memory cells are in the programmed status, the memory cells may be turned off. Therefore, the charges on the sensing node SO might not be discharged to the source line SL through the bit line BL1, and the voltage level of the sensing node SO may stay to the level of the first operational voltage VOP1 or may be lowered to a second sensing level VS2 that is slightly lower than the first operational voltage VOP1.

Then, the third NMOS transistor N3 may be turned off in response to the second coupling signal SS2 that transitions from a logic high level to a logic low level. Therefore, the sensing node SO may be isolated from the bit line BL1. When the second coupling signal SS2 becomes disabled, the evaluation interval EVAL may end, and the data storage interval STR may start.

In the data storage interval STR during the multi-string-based-erase-verification operation, the storage circuit 221 may store, therein, the value that corresponds to the voltage level of the sensing node SO. Specifically, in the data storage interval STR, the ninth NMOS transistor N9 may be turned on or off in response to the voltage level of the sensing node SO. Also, the eighth NMOS transistor N8 may be turned on in response to the set signal SET that is enabled to a logic high level. Therefore, when the eighth NMOS transistor N8 becomes turned on, the values of the data node QS and the inversion data node QSN may be determined according to the voltage level of the sensing node SO.

For example, when the voltage level of the sensing node SO is the first sensing level VS1, the ninth NMOS transistor N9 may be turned off and the data node QS may have a value "0" or a value of a logic low level. Based on the value of the data node QS, the control circuit 110 may determine that the first string ST11 and the second string ST21 are in the erased status.

For example, when the voltage level of the sensing node SO is the level of the first operational voltage VOP1 or the second sensing level VS2, the ninth NMOS transistor N9 may be turned on, and the data node QS may have a value "1" or a value of a logic high level. Based on the value of the data node QS, the control circuit 110 may determine that at least one of the first string ST11 and the second string ST21 is in the programmed status.

According to an embodiment, based on the value of the inversion data node QSN, the control circuit 110 may determine that the first string ST11 and the second string ST21 are in the erased status, or at least one of the first string ST11 and the second string ST21 is in the programmed status.

Although not illustrated, the discharge signal DCS may become enabled to discharge the sensing node SO after completion of the multi-string-based-erase-verification operation.

Figure 8:
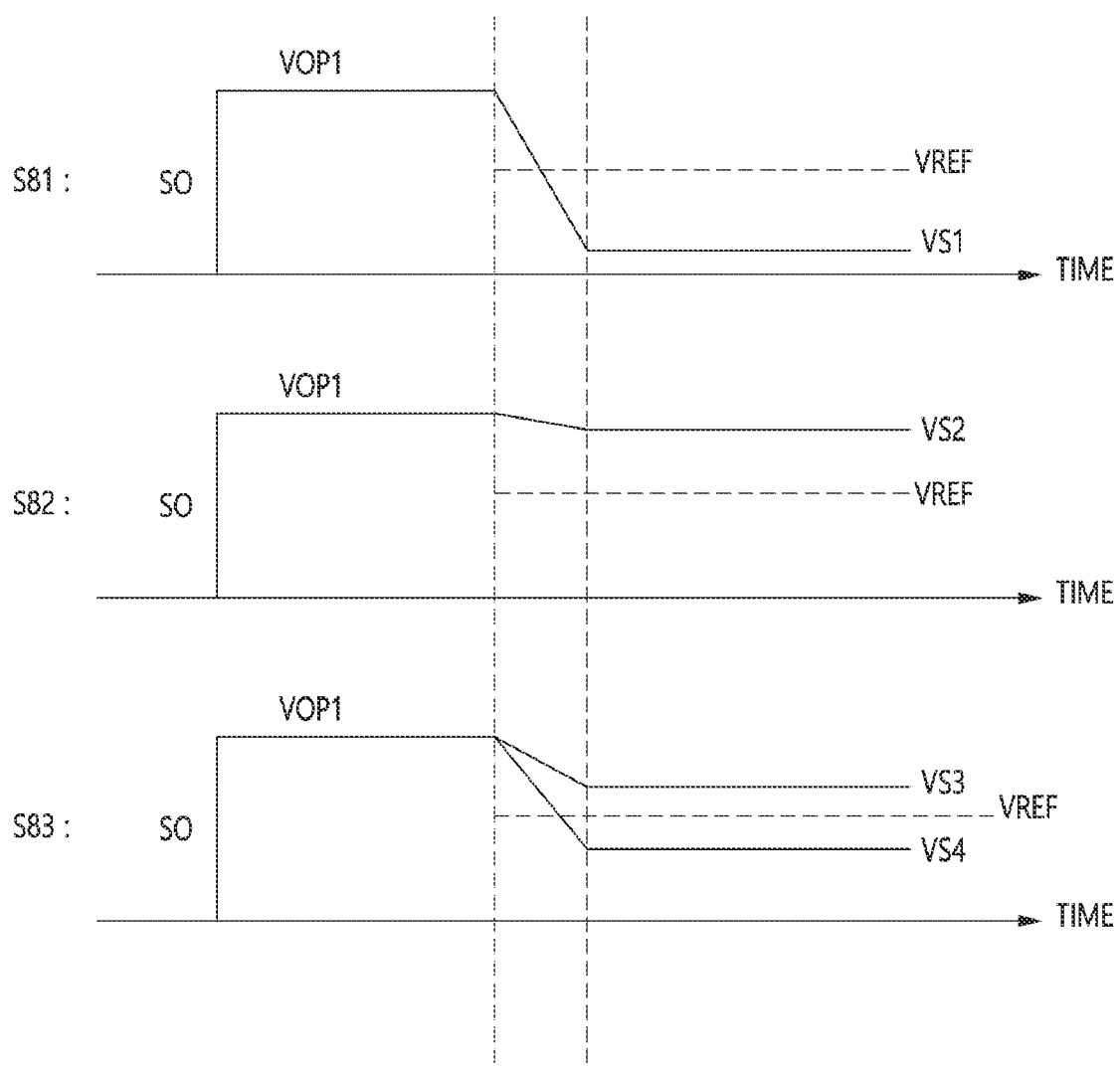
FIG. 8 is a diagram illustrating situations that can occur in an evaluation interval when an enhancive circuit does not operate during a multi-string-based-erase-verification operation on first and second strings.

FIG. 8 is a diagram illustrating situations S81 to S83 that can occur in the evaluation interval EVAL when the enhancive circuit 230A does not operate during a multi-string-based-erase-verification operation on the first and second strings ST11 and ST21. Situations S81 to S83 may be ones that can occur when the page buffer circuit PB1A does not include the enhancive circuit 230A.

Referring to FIG. 8, a reference level VREF may be a minimum voltage level of the sensing node SO that can turn on the ninth NMOS transistor N9 and change an initial value on the inversion data node QSN.

In situation S81, both the first string ST11 and the second string ST21 may be in the erased status. As described above, in the evaluation interval EVAL during the multi-string-based-erase-verification operation, the charges on the sensing node SO may be discharged to the source line SL through the first string ST11 and the second string ST21, and the voltage level of the sensing node SO may be lowered to the first sensing level VS1. The first sensing level VS1 may be lower than the reference level VREF. In this case, the ninth NMOS transistor N9 may be turned off, and based on the value of the data node QS, the control circuit 110 may determine that the first string ST11 and the second string ST21 are in the erased status.

In situation S82, both the first string ST11 and the second string ST21 may be in the programmed status. As described above, in the evaluation interval EVAL during the multi-string-based-erase-verification operation, the charges on the sensing node SO might not be discharged to the source line SL through the first string ST11 and the second string ST21 and the voltage level of the sensing node SO may be lowered to the second sensing level VS2. The second sensing level VS2 may be higher than the reference level VREF. In this case, the ninth NMOS transistor N9 may be turned on and, based on the value of the data node QS, the control circuit 110 may determine that the first string ST11 and the second string ST21 are in the programmed status.

In situation S83, the first string ST11 may be in the erased status, and the second string ST21 may be in the programmed status. As described above, in the evaluation interval EVAL, during the multi-string-based-erase-verification operation, the charges on the sensing node SO may be discharged to the source line SL through the first string ST11 but might not be discharged to the source line SL through the second string ST21, and accordingly, the voltage level of the sensing node SO may be lowered to a third sensing level VS3. The third sensing level VS3 may be lower than the second sensing level VS2 and may be higher than the reference level VREF. In this case, the ninth NMOS transistor N9 may be turned on and, based on the value of the data node QS, the control circuit 110 may determine that the first string ST11 and the second string ST21 are in the programmed status.

However, due to various reasons (e.g., uneven characteristics of elements), the voltage level of the sensing node SO may be lowered even to a fourth sensing level VS4 in situation S83. The fourth sensing level VS4 may be higher than the first sensing level VS1 and may be lower than the reference level VREF. In this case, the ninth NMOS transistor N9 may be turned off, and based on the value of the data node QS, the control circuit 110 may erroneously determine that the first string ST11 and the second string ST21 are in the erased status.

In the case that at least one string is in the programmed status within the first string group STG1 as illustrated in situation S83, the control circuit 110 may normally determine that the first string ST11 and the second string ST21 are in the programmed status when the voltage level of the sensing node SO is higher than the reference level VREF but may erroneously determine that the first string ST11 and the second string ST21 are in the erased status when the voltage level of the sensing node SO is lower than the reference level VREF.

As described later, in the case that at least one string is in the programmed status within the string group in the evaluation interval EVAL during the multi-string-based-erase-verification operation, the enhancive circuit 230A may prevent the voltage level of the sensing node SO from decreasing to a lower level than the reference level VREF.

Figure 9:
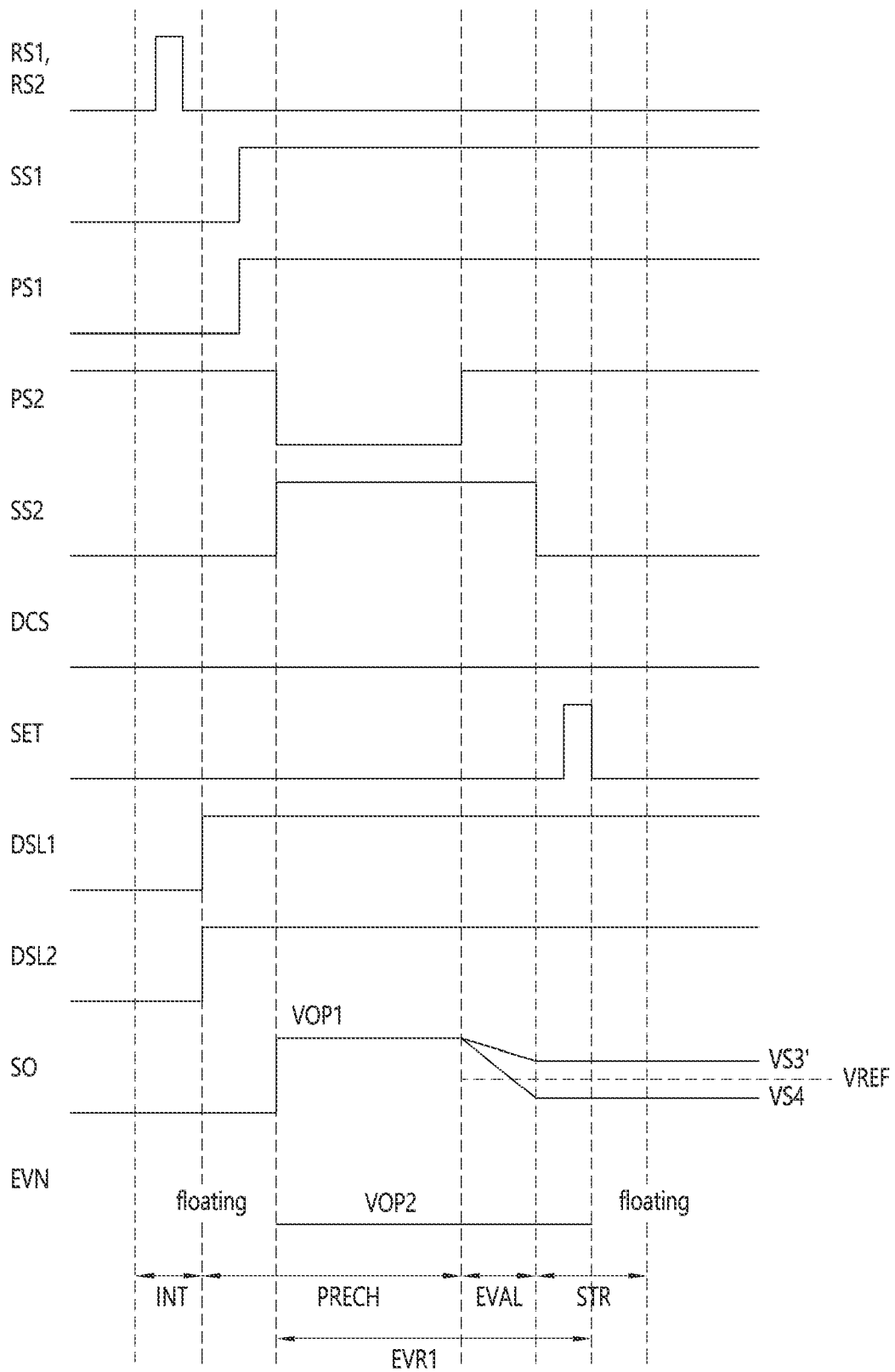
FIG. 9 is a timing diagram illustrating signals applied to a page buffer circuit of FIG. 6 when an enhancive circuit operates during a multi-string-based-erase-verification operation in accordance with an embodiment.

FIG. 9 is a timing diagram illustrating signals applied to a page buffer PB1A circuit of FIG. 6 when the enhancive circuit 230A operates during the multi-string-based-erase-verification operation in accordance with an embodiment. The multi-string-based-erase-verification operation may be performed, at the same time, on the first string ST11 and the second string ST21 included in the first string group STG1.

Referring to FIG. 9, the signals may move in the same way as those illustrated in FIG. 7 except signals on the enhancive node EVN.

In remaining intervals other than the enhancive interval EVR1 during the multi-string-based-erase-verification operation, the control circuit 110 may float the enhancive node EVN. In the enhancive interval EVR1 during the multi-string-based-erase-verification operation, the control circuit 110 may apply the second operational voltage VOP2, i.e., the ground voltage, to the enhancive node EVN.

In the enhancive interval EVR1, during the multi-string-based-erase-verification operation, the capacitor C1 may be charged to the first operational voltage VOP1 and may increase the capacitance of the sensing node SO.

The enhancive interval EVR1 may start when the sensing node SO starts to be charged to the first operational voltage VOP1. According to an embodiment, the enhancive interval EVR1 may start when the intermediate circuit 210 starts to apply the first operational voltage VOP1 to the sensing node SO. According to an embodiment, the enhancive interval EVR1 may start when the first pre-charge signal PS1 becomes enabled, According to an embodiment, the enhancive interval EVR1 may start when the second pre-charge signal PS2 becomes enabled. According to an embodiment, the enhancive interval EVR1 may start when the second coupling signal SS2 becomes enabled.

The enhancive interval EVR1 may end when the set signal SET becomes disabled after being enabled. According to an embodiment, the enhancive interval EVR1 may end after the storage circuit 221 stores, therein, the value that corresponds to the voltage level of the sensing node SO. According to an embodiment, the enhancive interval EVR1 may end when the evaluation interval EVAL ends. According to an embodiment, the enhancive interval EVR1 may end when the second coupling signal SS2 becomes disabled.

The voltage level of the sensing node SO may change as follows. When the first string ST11 is in the erased status and the second string ST21 is in the programmed status within the first string group STG1 in the evaluation interval EVAL during the multi-string-based-erase-verification operation, the charges on the sensing node SO may be discharged to the source line SL through the first string ST11 but might not be discharged to the source line SL through the second string ST21. In this case, if the enhancive circuit 230A is not included or does not operate within the page buffer circuit PB1A, the voltage level of the sensing node SO may be lowered even to the fourth sensing level VS4 as the case may be. However, the capacitance of the sensing node SO becomes greater because of the operation of the enhancive circuit 230A, and therefore, the voltage level of the sensing node SO may be lowered to a third sensing level VS3'. The third sensing level VS3' may be higher than the reference level VREF. The third sensing level VS3' may be different from the third sensing level VS3 of FIG. 8. Therefore, the ninth NMOS transistor N9 may be turned on, and based on the value of the data node QS, the control circuit 110 may determine that the first string ST11 and the second string ST21 are in the programmed status. That is, by increasing the capacitance of the sensing node SO, the enhancive circuit 230A may prevent the voltage level of the sensing node SO from decreasing to a lower level than the reference level VREF in the case in which at least one string is in the programmed status within the string group in the evaluation interval EVAL during the multi-string-based-erase-verification operation.

Figure 10:
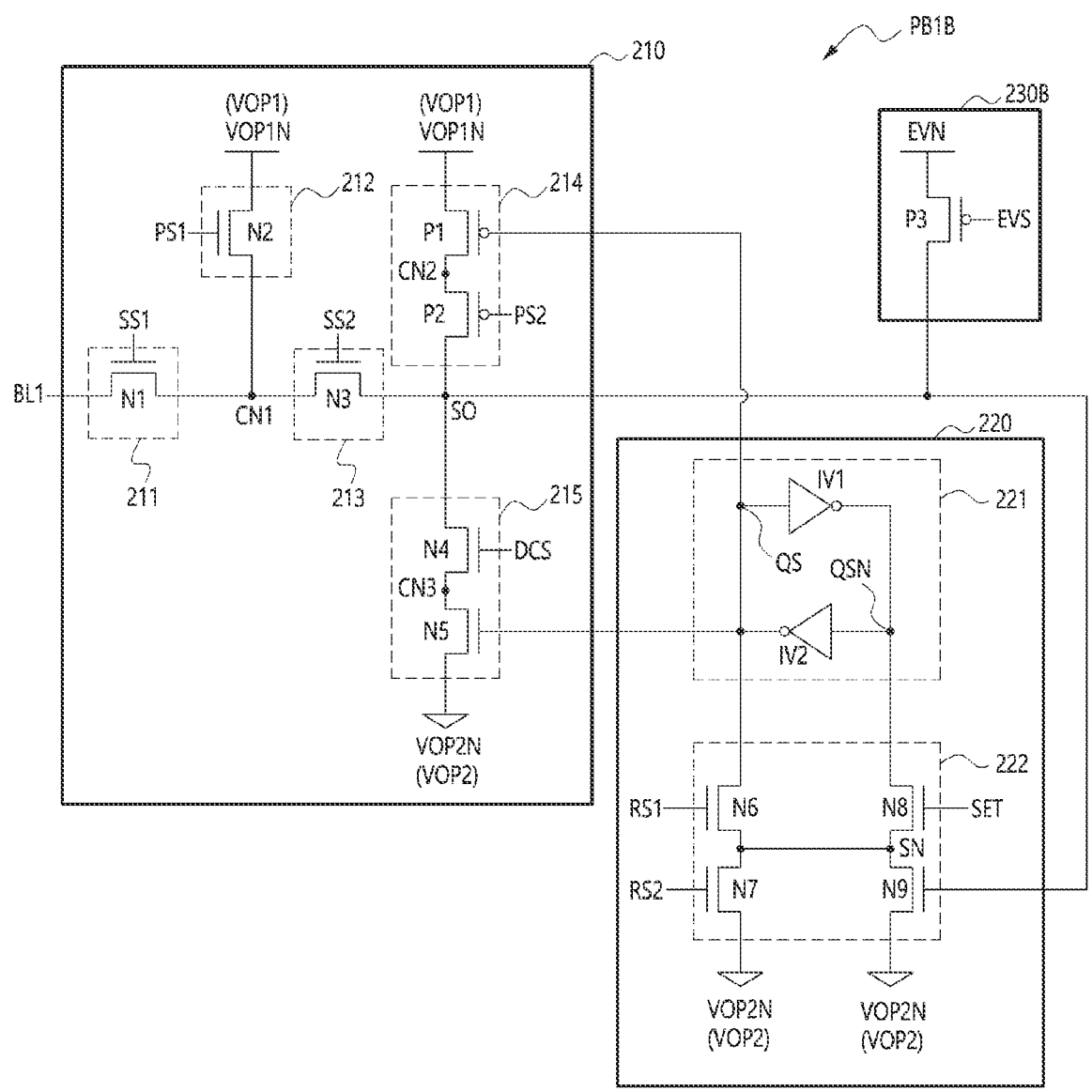
FIG. 10 is a detailed circuit diagram illustrating a page buffer circuit of FIG. 1 in accordance with an embodiment.

FIG. 10 is a detailed circuit diagram illustrating a page buffer circuit PB1B of FIG. 1 in accordance with an embodiment. Each of the page buffer circuits PB1 to PBm of FIG. 1 may be configured and operate in the similar way to the page buffer circuit PB1B.

Referring to FIG. 10, the page buffer circuit PB1B may have the same configuration as the page buffer circuit PB1A of FIG. 6, except the enhancive circuit 230B.

The enhancive circuit 230B may be coupled between the enhancive node EVN and the sensing node SO. In a predetermined enhancive interval EVR2, during the multi-string-based-erase-verification operation, the enhancive circuit 230B may apply a third operational voltage VOP3 (i.e., an enhancive voltage), which is higher than the first operational voltage VOP1, to the sensing node SO. In the enhancive interval EVR2, during the multi-string-based-erase-verification operation, the enhancive circuit 230B may increase the voltage level (i.e., a precharging level), to which the sensing node SO is charged.

In the enhancive interval EVR2 during the multi-string-based-erase-verification operation, the enhancive node EVN may be provided with the third operational voltage VOP3. In the remaining intervals other than the enhancive interval EVR2 during the multi-string-based-erase-verification operation, the enhancive node EVN may be provided with the first operational voltage VOP1. Also, the enhancive node EVN may be provided with the first operational voltage VOP1 while the multi-string-based-erase-verification operation is not being performed.

The enhancive circuit 230B may include a third PMOS transistor P3. The third PMOS transistor P3 may be coupled between the enhancive node EVN and the sensing node SO. In response to an enhancive signal EVS that is enabled in the enhancive interval EVR2, the third PMOS transistor P3 may couple the enhancive node EVN to the sensing node SO. In response to the enhancive signal EVS that is enabled in the enhancive interval EVR2, the third PMOS transistor P3 may transfer, to the sensing node SO, the third operational voltage VOP3 that is applied to the enhancive node EVN.

In the enhancive interval EVR2, during the multi-string-based-erase-verification operation, the enhancive signal EVS may have the level of the second operational voltage VOP2, that is, the ground voltage. In the remaining intervals other than the enhancive interval EVR2 during the multi-string-based-erase-verification operation, the enhancive signal EVS may have the level of the first operational voltage VOP1. That is, in the remaining intervals, other than the enhancive interval EVR2, during the multi-string-based-erase-verification operation, the enhancive signal EVS and the enhancive node EVN may have the same voltage level.

Figure 11:
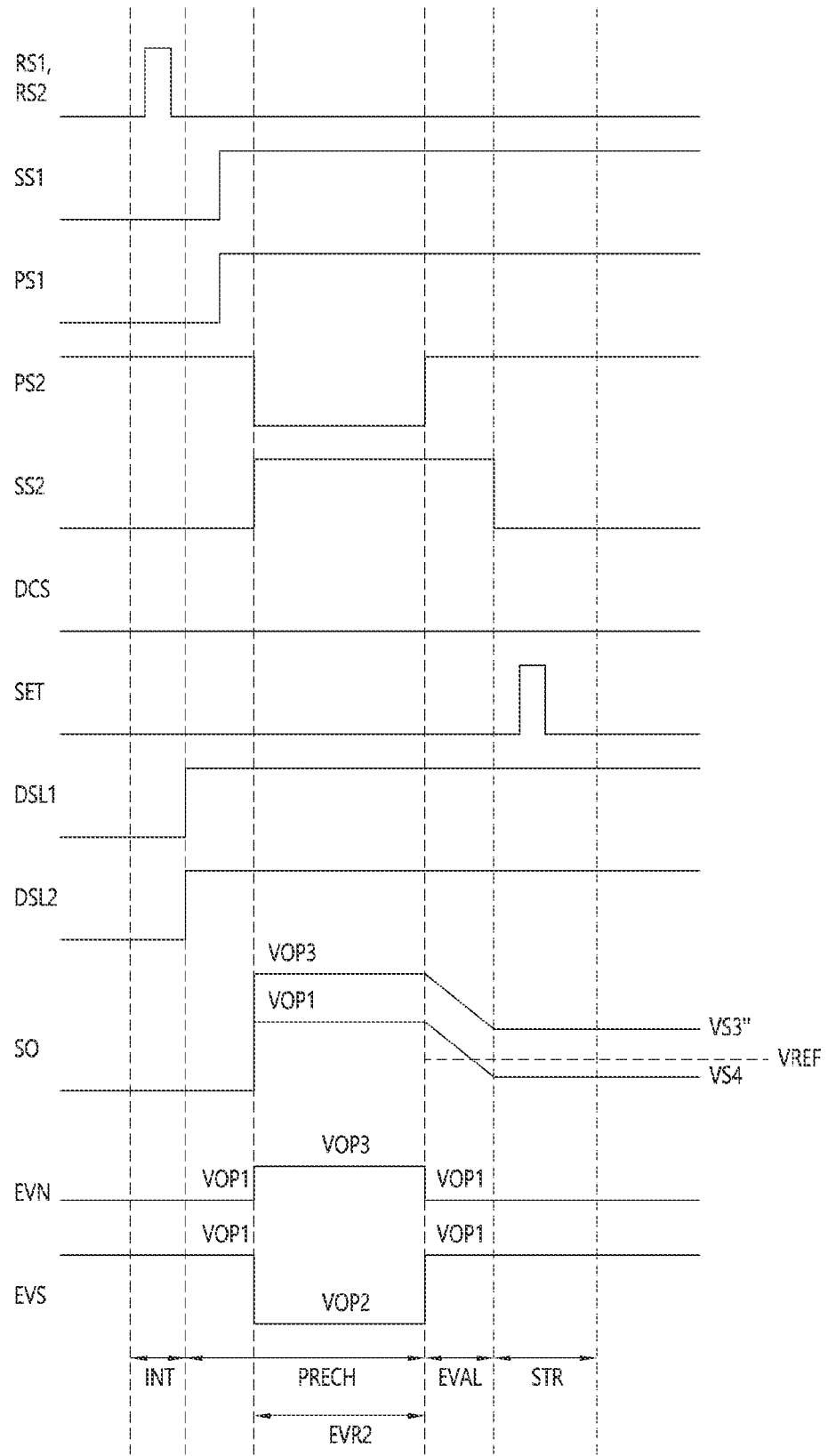
FIG. 11 is a timing diagram illustrating signals applied to a page buffer circuit of FIG. 10 when an enhancive circuit operates during a multi-string-based-erase-verification operation in accordance with an embodiment.

FIG. 11 is a timing diagram illustrating signals applied to the page buffer circuit PB1B of FIG. 10 when the enhancive circuit 230B operates during the multi-string-based-erase-verification operation in accordance with an embodiment. The multi-string-based-erase-verification operation may be performed, at the same time, on the first string ST11 and the second string ST21 that are included in the first string group STG1.

Referring to FIG. 11, the signals may move in the same way as those illustrated in FIG. 7 except the enhancive signal EVS and signals on the enhancive node EVN.

In the remaining intervals, other than the enhancive interval EVR2, during the multi-string-based-erase-verification operation, the control circuit 110 may generate the enhancive signal EVS having the level of the first operational voltage VOP1 and may supply the first operational voltage VOP1 to the enhancive node EVN. In the enhancive interval EVR2 during the multi-string-based-erase-verification operation, the control circuit 110 may generate the enhancive signal EVS having the level of the second operational voltage VOP2 and may supply the third operational voltage VOP3, which is higher than the first operational voltage VOP1, to the enhancive node EVN. In the enhancive interval EVR2, during the multi-string-based-erase-verification operation, the third PMOS transistor P3 may couple the enhancive node EVN to the sensing node SO in response to the enhancive signal EVS. The sensing node SO may be charged to the third operational voltage VOP3.

According to an embodiment, the enhancive interval EVR2 may start when the first pre-charge signal PS1 becomes enabled. According to an embodiment, the enhancive interval EVR2 may start when the second pre-charge signal PS2 becomes enabled. According to an embodiment, the enhancive interval EVR2 may start, at the latest, when the intermediate circuit 210 starts applying the first operational voltage VOP1 to the sensing node SO. According to an embodiment, the enhancive interval EVR2 may start when the second coupling signal SS2 becomes enabled.

The enhancive interval EVR2 may end when the pre-charge interval PRECH ends and the evaluation interval EVAL starts. According to an embodiment, the enhancive interval EVR2 may end when the intermediate circuit 210 stops the supply of the first operational voltage VOP1 to the sensing node SO. According to an embodiment, the enhancive interval EVR2 may end when the second pre-charge signal PS2 becomes disabled.

The voltage level of the sensing node SO may change as follows. When the first string ST11 is in the erased status and the second string ST21 is in the programmed status within the first string group STG1 in the evaluation interval EVAL during the multi-string-based-erase-verification operation, the charges on the sensing node SO may be discharged to the source line SL through the first string ST11 but might not be discharged to the source line SL through the second string ST21. In this case, if the enhancive circuit 230B is not included or does not operate within the page buffer circuit PB1B, the voltage level of the sensing node SO may become the level of the first operational voltage VOP1 or may be lowered even to the fourth sensing level VS4 as the case may be. However, the sensing node SO may be charged to the third operational voltage VOP3 that is higher than the first operational voltage VOP1 because of the operation of the enhancive circuit 230B, and therefore, the voltage level of the sensing node SO may be lowered to a third sensing level VS3". The third sensing level VS3" may be higher than the reference level VREF. The third sensing level VS3" may be different from the third sensing level VS3 of FIG. 8. Therefore, the ninth NMOS transistor N9 may be turned on, and based on the value of the data node QS, the control circuit 110 may determine that the first string ST11 and the second string ST21 are in the programmed status. That is, by increasing the pre-charged level of the sensing node SO to the third operational voltage VOP3, the enhancive circuit 230B may prevent the voltage level of the sensing node SO from decreasing to a lower level than the reference level VREF in the case in which at least one string is in the programmed status within the string group in the evaluation interval EVAL during the multi-string-based-erase-verification operation.

When the enhancive circuit 230B operates, the first sensing level VS1 and second sensing level VS2 may also increase eventually in situations described with reference to FIG. 8.

The operation principles of the enhancive circuit 230A of FIG. 6 and the enhancive circuit 230B of FIG. 10 may be as follows. With reference to the reference level VREF, a reference current may be expressed in the following equation.

reference current=C(SO)*(VSO−VREF)/EVALT, where "C(SO)" represents the capacitance of the sensing node SO, "VSO" represents the pre-charged level of the sensing node SO and "EVALT" represents a time length of the evaluation interval EVAL.

As can be known from the above equation, the reference level VREF and the reference current may be inversely proportional to each other. Also, in the situations of FIG. 8, the voltage level of the sensing node SO may be lowered to the fourth sensing level VS4 because the value of the reference current is too small. Accordingly, when the value of the reference current adequately increases, the voltage level of the sensing node SO may be lowered to a higher level than the reference level VREF in the evaluation interval EVAL during the multi-string-based-erase-verification operation.

In the above equation, the increase of the value of the reference current may be obtained by increasing "C(SO)" or "VSO". The enhancive circuit 230A of FIG. 6 may increase "C(SO)" in the above equation. The enhancive circuit 230B of FIG. 10 may increase "VSO" in the above equation.

Figure 12:
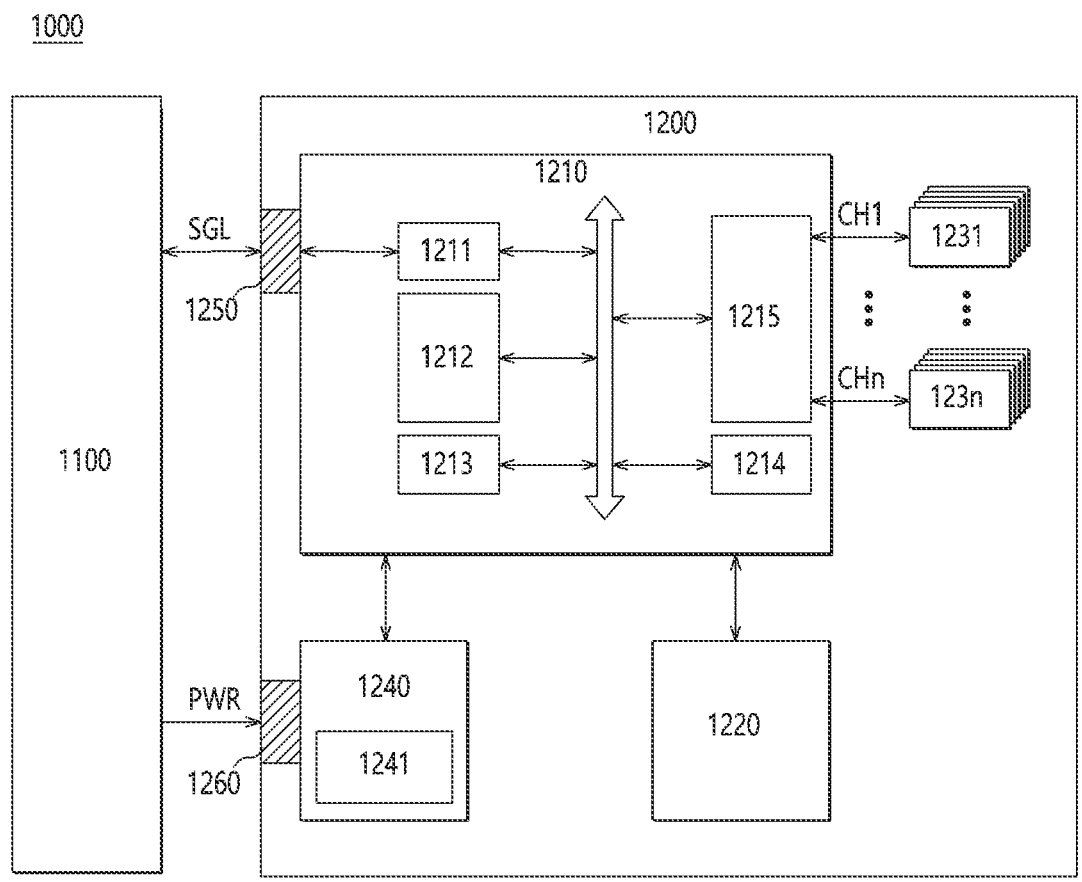
FIG. 12 is a diagram illustrating a data processing system including a solid state drive (SSD) in accordance with an embodiment.

FIG. 12 is a diagram illustrating a data processing system 1000 including a solid state drive (SSD) 1200 in accordance with an embodiment. Referring to FIG. 12, the data processing system 1000 may include a host device 1100 and the SSD 1200.

The SSD 1200 may include a controller 1210, a buffer memory device 1220, a plurality of nonvolatile memory devices 1231 to 1203n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols, such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnect (PCI), PCI express (PCI-E). and universal flash storage (UFS).

The control unit 1212 may analyze and process the signal SGL that is received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data that is read from at least one of the nonvolatile memory devices 1231 to 123n, based on the parity data. If a detected error is within a correctable range, the ECC unit 1214 may correct the detected error.

The memory interface unit 1215 may provide control signals, such as commands and addresses, to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data that is stored in the buffer memory device 1220, to at least one of the nonvolatile memory devices 1231 to 123n, or provide the data that is read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data that is read from at least one of the nonvolatile memory devices 1231 to 123n. The data that is temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to respectively. One or more nonvolatile memory devices may be coupled to one channel. The nonvolatile memory devices that are coupled to each channel may be coupled to the same signal bus and data bus. Each of the nonvolatile memory devices 1231 to 123n may include the nonvolatile memory device 100, shown in FIG. 1.

The power supply 1240 may provide power PWR, input through the power connector 1260, to the interior of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

Figure 13:
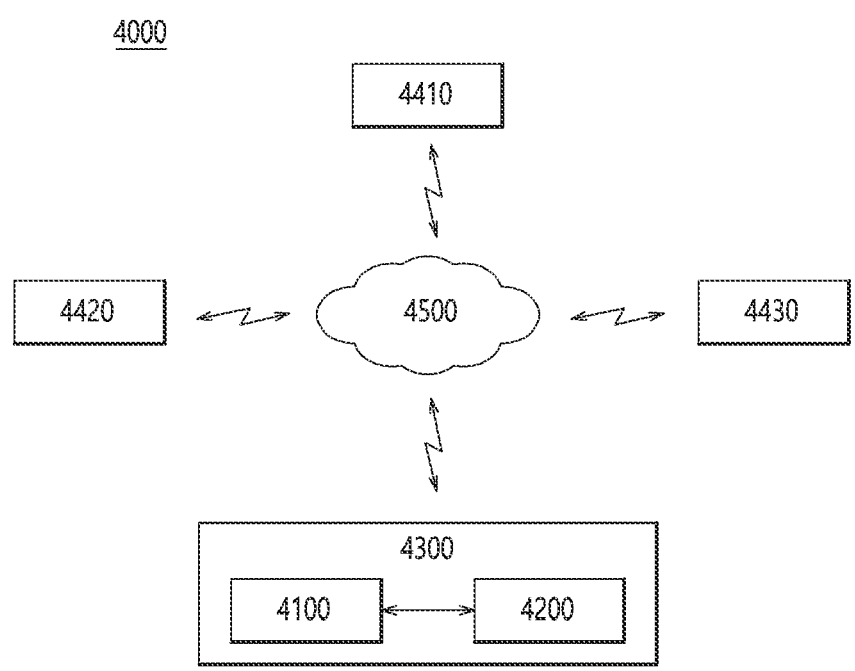
FIG. 13 is a diagram illustrating a network system including a memory system in accordance with an embodiment.

The power connector 1260 may be configured by various types of connectors depending on a power supply scheme of the host device 1100, FIG. 13 is a diagram illustrating a network system 4000 including a memory system 4200 in accordance with an embodiment. Referring to FIG. 13, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the SSD 1200, shown in FIG. 12.

In accordance with an embodiment, the page buffer circuit and the nonvolatile memory device including the same may improve the speed and the accuracy of an erase-verification operation.

While certain embodiments have been described above, it will be understood to those skilled in the art that the embodiments described are by way of example only. Accordingly, the page buffer circuit and the nonvolatile memory device including the same should not be limited based on the described embodiments. Rather, the page buffer circuit and the nonvolatile memory device including the same described herein should only be limited in light of the claims that follow when taken in conjunction with the above description and accompanying drawings.

What is claimed is:

1. A page buffer circuit comprising:
   an intermediate circuit coupled to a bit line coupled to a memory region and configured to apply a voltage having a voltage level, corresponding to a status of the memory region, to a sensing node;

a data storage circuit configured to store, therein, a value that corresponds to the status of the memory region in response to the voltage level; and a capacitor coupled between an enhancive node and the sensing node, wherein the enhancive node is configured to receive a ground voltage in an enhancive interval and is configured to be floated in intervals other than the enhancive interval, during a selected operation.

2. The page buffer circuit of claim 1, wherein the selected operation is a multi-string-based-erase-verification operation for simultaneously verifying whether a plurality of strings coupled to the bit line are in an erased status.

3. The page buffer circuit of claim 1,
wherein the intermediate circuit is configured to apply a first operational voltage to the sensing node to pre-charge the sensing node, and
wherein the enhancive interval starts when the intermediate circuit starts applying the first operational voltage to the sensing node.

4. The page buffer circuit of claim 1, wherein the enhancive interval ends after the data storage circuit stores the value therein.

5. A nonvolatile memory device comprising:
a plurality of strings coupled to a bit line;
a control circuit configured to control a multi-string-based-erase-verification operation on the plurality of strings; and a page buffer circuit coupled to the bit line and including a capacitor coupled between a sensing node coupled to the bit line and an enhancive node, wherein the enhancive node is configured to receive a ground voltage in an enhancive interval and is configured to be floated in intervals other than the enhancive interval, during the multi-string-based-erase-verification operation.

6. The nonvolatile memory device of claim 5, wherein the page buffer circuit further includes:
an intermediate circuit configured to pre-charge the sensing node and configured to apply a voltage having a voltage level, corresponding to a status of the plurality of strings, to the sensing node; and
a data storage circuit configured to store, therein, a value that corresponds to the status of the plurality of strings in response to the voltage level.

7. The nonvolatile memory device of claim 6, wherein the capacitor is configured to increase a capacitance of the sensing node in the enhancive interval.

8. The nonvolatile memory device of claim 7, wherein the enhancive interval starts when the intermediate circuit starts precharging the sensing node, and the enhancive interval ends after the data storage circuit stores the value therein.

* * * * *